US008854066B2

(12) United States Patent
Shea

(10) Patent No.: US 8,854,066 B2
(45) Date of Patent: Oct. 7, 2014

(54) METHOD AND APPARATUS FOR DETECTING A GLOWING CONTACT IN A POWER CIRCUIT

(75) Inventor: John J. Shea, Pittsburgh, PA (US)

(73) Assignee: Eaton Corporation, Cleveland, OH (US)

( * ) Notice: Subject to any disclaimer, the term of this patent is extended or adjusted under 35 U.S.C. 154(b) by 281 days.

(21) Appl. No.: 13/440,243

(22) Filed: Apr. 5, 2012

(65) Prior Publication Data

US 2013/0265065 A1    Oct. 10, 2013

(51) Int. Cl.
*G01R 27/08*    (2006.01)
(52) U.S. Cl.
USPC .......................................... 324/705; 361/103
(58) Field of Classification Search
USPC .............. 324/705–713, 600, 647–652, 76.11, 324/76.77–76.83, 500, 750.01–750.02, 324/750.3, 142, 105; 340/650, 540, 340/657–662; 361/42, 93.1, 94, 103
See application file for complete search history.

(56) References Cited

U.S. PATENT DOCUMENTS

| 6,031,341 | A  | * | 2/2000  | Yoshizawa et al. ........... 315/276 |
| 6,215,310 | B1 | * | 4/2001  | Petrovich et al. ............ 324/378 |
| 6,549,013 | B1 | * | 4/2003  | Uhl .............................. 324/378 |
| 6,707,652 | B2 |   | 3/2004  | Engel |
| 6,948,846 | B2 |   | 9/2005  | Engel |
| 7,068,045 | B2 | * | 6/2006  | Zuercher et al. .............. 324/536 |
| 8,023,235 | B2 | * | 9/2011  | Bilac et al. ...................... 361/42 |
| 2004/0027749 | A1 | | 2/2004 | Zuercher et al. |
| 2004/0218330 | A1 | | 11/2004 | Natili et al. |
| 2006/0164097 | A1 | | 7/2006 | Zhou et al. |
| 2008/0100305 | A1 | | 5/2008 | Gass et al. |
| 2010/0046126 | A1 | | 2/2010 | Elms |
| 2010/0149700 | A1 | | 6/2010 | Hastings et al. |
| 2011/0090607 | A1 | | 4/2011 | Luebke et al. |
| 2011/0141644 | A1 | | 6/2011 | Hastings et al. |

OTHER PUBLICATIONS

John J. Shea, IEEE 1-4244-0838-May 2007, "Material Effect on Glowing Contact Properties".*
European Patent Office, "International Search Report and Written Opinion", Jul. 2, 2013, 9 pages.

* cited by examiner

*Primary Examiner* — Melissa Koval
*Assistant Examiner* — Trung Nguyen
(74) *Attorney, Agent, or Firm* — Eckert Seamans Cherin & Mellott, LLC; Kirk D. Houser

(57) ABSTRACT

A method detects a glowing contact in a power circuit. The method applies at least two different resistance values across the power circuit and responsively senses at least two voltages across the power circuit. Each of the at least two voltages correspond to one of the at least two different resistance values. Then, the method determines if a number of changes in the sensed at least two voltages with respect to a number of changes in the at least two different resistance values is linear within a predetermined range or if a change in two of the sensed at least two voltages does not increase with a decrease in two of the at least two different resistance values and, otherwise, responsively generates at least one of a trip signal and an alarm signal corresponding to detecting the glowing contact in the power circuit.

14 Claims, 4 Drawing Sheets

METHOD AND APPARATUS FOR DETECTING A GLOWING CONTACT IN A POWER CIRCUIT

BACKGROUND

1. Field

The disclosed concept pertains generally to glowing contacts in power circuits and, more particularly, to methods of detecting such glowing contacts. The disclosed concept also pertains to apparatus for detecting glowing contacts in power circuits.

2. Background Information

Circuit interrupters include, for example, circuit breakers, receptacles, contactors, motor starters, motor controllers and other load controllers.

A glowing contact is a high resistance electrical connection, which can form, for example and without limitation, at the interface of a conductor (e.g., wire) and a screw terminal (e.g., line terminal; neutral terminal), for example, of a receptacle. A glowing contact is also possible, for example and without limitation, at a receptacle outlet where a male three-prong plug mates with three-sets of outlet contact blades of the receptacle outlet. A glowing contact at a receptacle is known to produce substantial heat that can melt the receptacle and start a fire. It is very easy to create a high resistance or glowing contact at a receptacle terminal using copper wire. The hazards associated with glowing contacts, including contacts made with all combinations of copper, brass and iron are known. See, for example, U.S. Pat. Nos. 6,948,846; and 6,707,652.

According to UL 1699 (Arc-Fault Circuit-Interrupters) (scope 1.3), arc fault circuit interrupters (AFCIs) providing arc fault detection are not intended to detect glowing connections and, thus, it is believed that AFCIs do not provide glowing contact protection.

Overheated electrical connections can result from loose connections in electrical components such as panelboards, load centers, electrical outlets and lighting switches. Frequently, these electrical connections go undetected, can lead to the destruction of the electrical component, and many times create a fire.

It is known to employ a temperature sensor (e.g., a thermal relay; a bimetal) to sense a temperature at about 200° C. and provide glowing contact protection for a receptacle.

U.S. Pat. No. 6,707,652 discloses a receptacle including a first temperature sensor that outputs a first signal representative of a first temperature of a line circuit, a second temperature sensor that outputs a second signal representative of a second temperature of a neutral circuit, and a circuit that provides a glowing contact trip signal as a function of a difference between the first temperature and the second temperature.

It is also known to detect glowing contacts or resulting overheated conditions by detecting smoke or gas emitted from overheated plastic, by employing active acoustic sensing to detect an electrical conductivity fault of a power circuit, or by other mechanisms to protect from overheating conditions.

There is room for improvement in methods of detecting glowing contacts in a power circuit.

There is room for improvement in apparatus for detecting glowing contacts in a power circuit.

SUMMARY

These needs and others are met by embodiments of the disclosed concept in which different impedances are applied across a power circuit and voltages are responsively sensed across the power circuit. Each of the voltages corresponds to one of the different impedances. It is determined if a number of changes in the sensed voltages with respect to a number of changes in the different impedances is linear within a predetermined range or if a change in two sensed voltages does not increase with a decrease in two different resistance values and, otherwise, at least one of a trip signal and an alarm signal corresponding to detecting a glowing contact in the power circuit are responsively generated.

In accordance with one aspect of the disclosed concept, a method of detecting a glowing contact in a power circuit comprises: applying at least two different resistance values across the power circuit and responsively sensing at least two voltages across the power circuit, each of the at least two voltages corresponding to one of the at least two different resistance values; and determining if a number of changes in the sensed at least two voltages with respect to a number of changes in the at least two different resistance values is linear within a predetermined range or if a change in two of the sensed at least two voltages does not increase with a decrease in two of the at least two different resistance values and, otherwise, responsively generating at least one of a trip signal and an alarm signal corresponding to detecting the glowing contact in the power circuit.

As another aspect of the disclosed concept, an apparatus detects a glowing contact in a power circuit. The apparatus comprises: a plurality of resistors; a plurality of switches structured to switch a number of the resistors across the power circuit; a voltage sensor structured to sense a voltage across the number of the resistors switched across the power circuit; a processor structured to control the plurality of switches to switch at least two different resistance values across the power circuit, to input the sensed voltage corresponding to each of the at least two different resistance values, and to determine if a number of changes in the sensed voltage with respect to a number of changes in the at least two different resistance values is linear within a predetermined range or if a change in the sensed voltage does not increase with a decrease in two of the at least two different resistance values and, otherwise, to responsively generate at least one of a trip signal and an alarm signal corresponding to detecting the glowing contact in the power circuit; and an output of the at least one of the trip signal and the alarm signal.

As another aspect of the disclosed concept, a method of detecting a glowing contact in a power circuit comprises: applying at least two different impedances across the power circuit and responsively sensing at least two voltages across the power circuit, each of the sensed at least two voltages corresponding to one of the at least two different impedances; and determining if a number of changes in the sensed at least two voltages with respect to a number of changes in the at least two different impedances is linear within a predetermined range or if a change in two of the sensed at least two voltages does not increase with a decrease in two of the at least two different impedances and, otherwise, responsively generating at least one of a trip signal and an alarm signal corresponding to detecting the glowing contact in the power circuit.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" shall mean a programmable analog and/or digital device that can store, retrieve, and process data; a computer; a workstation; a personal computer; a microprocessor; a microcontroller; a microcomputer; a controller; a central processing unit; a mainframe computer; a mini-computer; a server; a networked processor; or any suitable processing device or apparatus.

As employed herein, the term "glowing contact" shall mean the same as a "glowing connection". A glowing contact or glowing connection is a high resistance electrical connection formed at the interface of two conductors and which is subject to heating or overheating by current flowing therethrough.

A glowing contact produces a significantly higher voltage drop as compared to a secure electrical connection. By monitoring the voltage across a power circuit, which is susceptible to a loose connection, at different current levels flowing through the power circuit, the glowing contact can be detected and a trip signal or alarm signal can be responsively generated.

Figure 1:
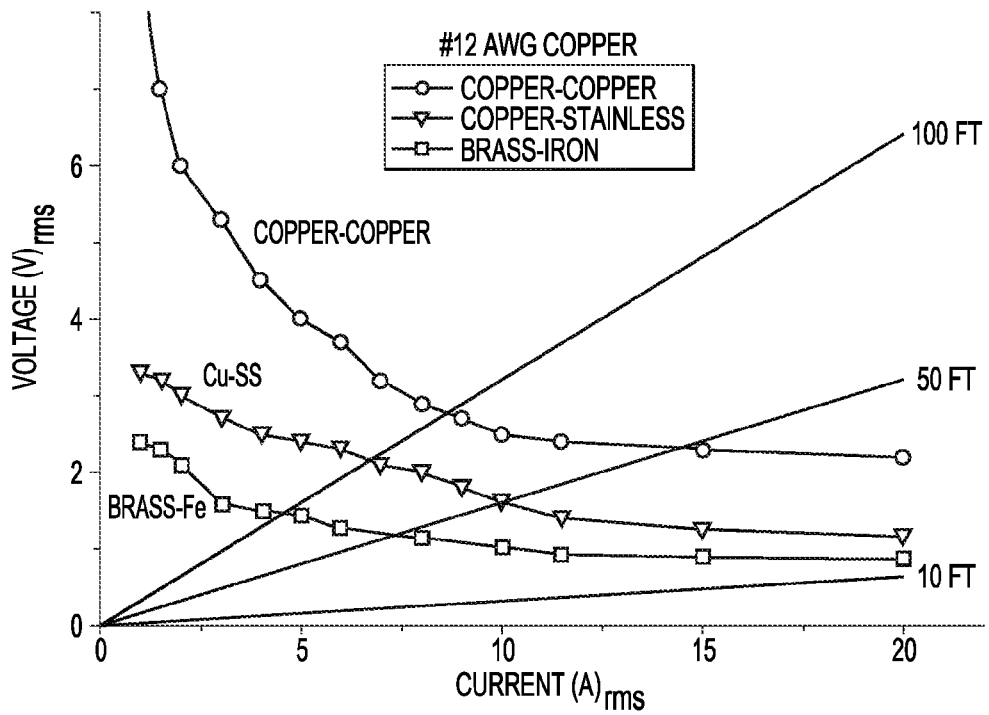
FIG. 1 is a plot of glowing voltage versus current for three different material combinations and current-resistance (IR) drop for three different wire lengths of a #12 AWG copper conductor, which is used for 20 ampere circuits.
Figure 2:
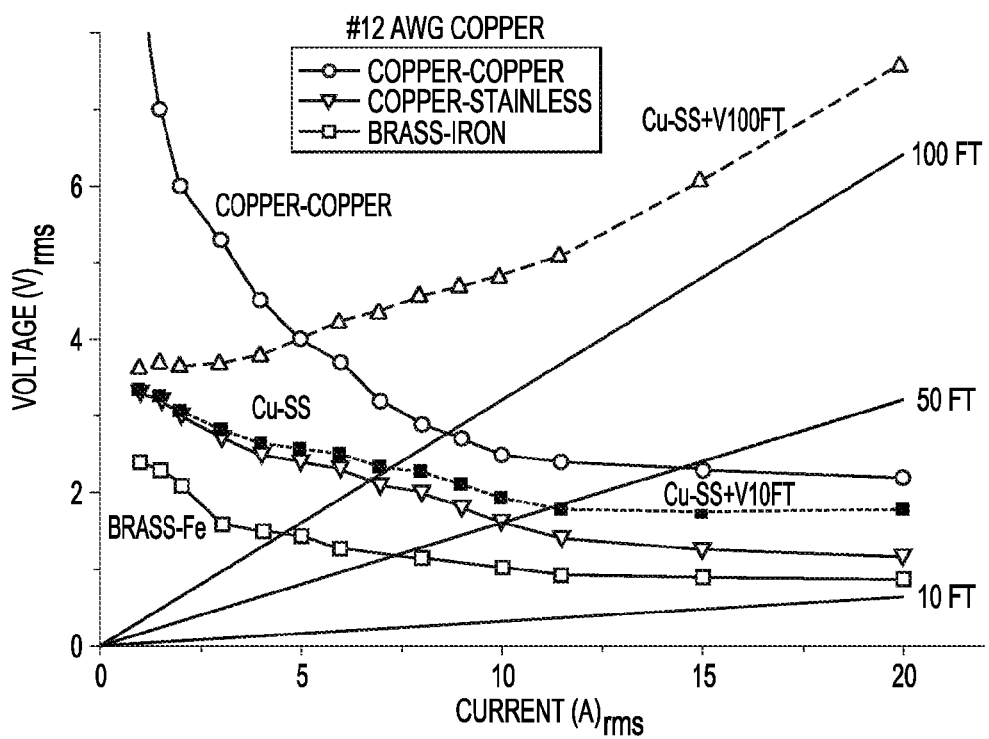
FIG. 2 is a plot of voltage versus current for the combined voltage drop of the glowing voltage plus the IR drop for two different wire lengths of FIG. 1.
Figure 3:
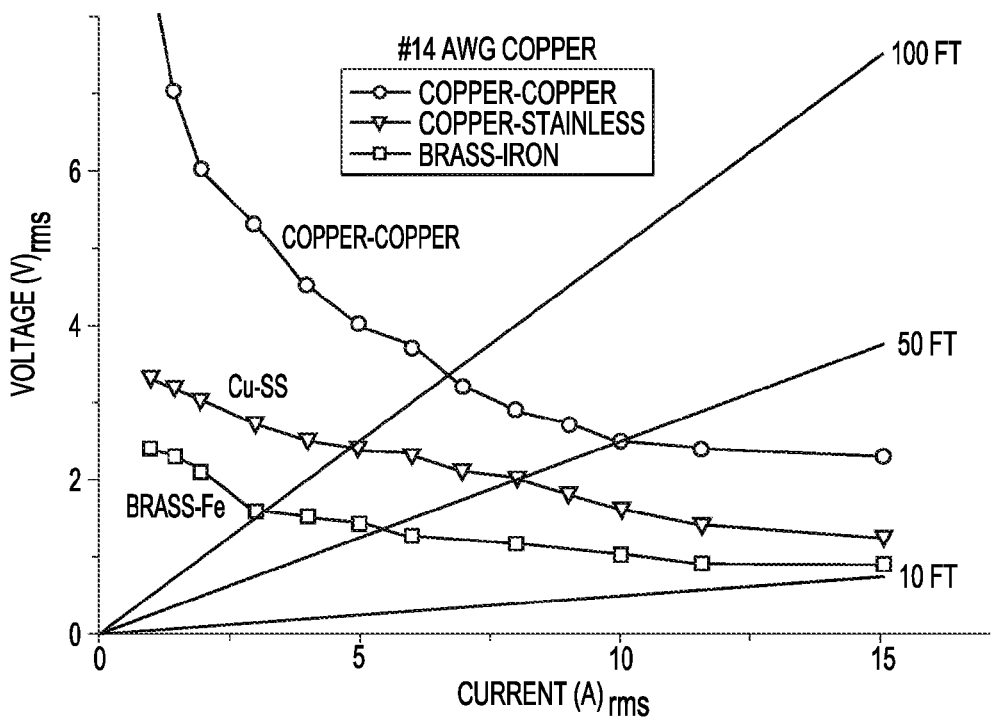
FIG. 3 is a plot of glowing voltage versus current for three different material combinations and IR drop for three different wire lengths of a #14 AWG copper conductor, which is used for 15 ampere circuits.

For a copper contact, typical loadings are in the range of about 10 g to about 10,000 g connection force, making a typical connection resistance in the range of about 1 mΩ to about 0.1 mΩ. At 20 A, this would make the voltage drop across a secure electrical connection in the range of about 2 $mV_{rms}$ to about 20 $mV_{rms}$. This is well below the voltage drop across a glowing connection which is above 1 V. In fact, the lower the current, the higher the glowing connection voltage as shown in FIGS. 1 and 3. Also, the power dissipated in a glowing connection is high enough, especially at currents above 10 $A_{rms}$, to overheat the electrical joint and heat the surrounding area to a level which may start a fire.

As shown in FIGS. 1-4, a glowing connection has a relatively high voltage drop at relatively low current (e.g., less than 5 $A_{rms}$) for various material combinations, such as copper-copper, copper-stainless steel, or brass-iron.

Figure 4:
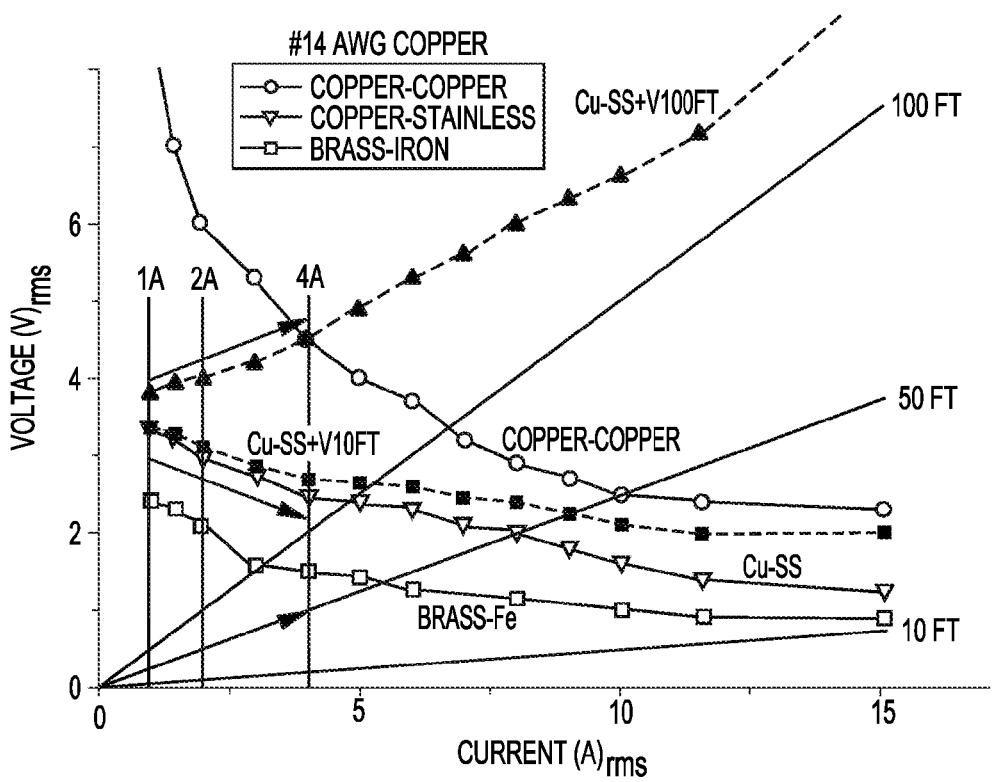
FIG. 4 is a plot of voltage versus current for the combined voltage drop of the glowing voltage plus the IR drop for two different wire lengths of FIG. 3, in which the three vertical lines indicate three applied current levels and the expected voltage drop in accordance with embodiments of the disclosed concept.
Figure 5:
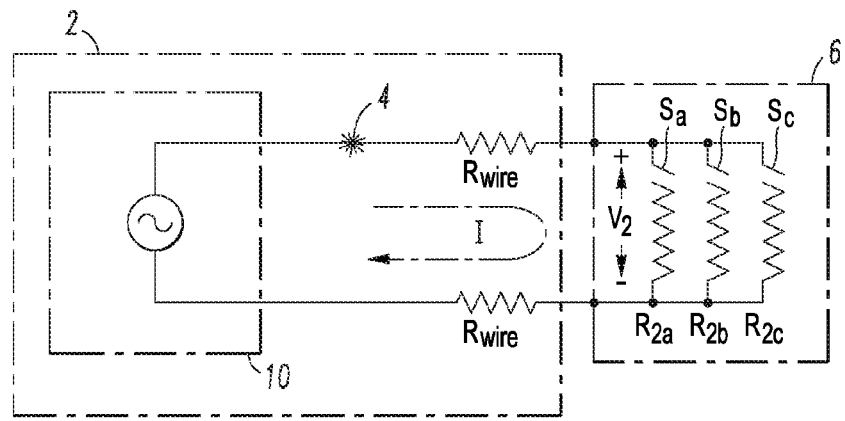
FIG. 5 is a block diagram in schematic form of a simplified residential branch circuit and an apparatus to detect a loose/glowing connection in accordance with embodiments of the disclosed concept.

With reference to FIGS. 4 and 5, without other load current flowing, a method to detect if a glowing contact is present is to load a power circuit 2 with a known resistance (e.g., by a combination of a number of resistors $R_{2a}, R_{2b}, R_{2c}$) and compare the change in the sensed voltage, $V_2$. A nonlinear voltage change is indicative of a problem. If there is no glowing connection, then voltage drop (which is equal to the power circuit current, I, times the resistance of the two power circuit conductors, $2R_{wire}$, or $2IR_{wire}$) in the power circuit 2 shown in FIG. 5 will be linear. Hence, when double the current, 2I, is applied to the power circuit 2, then the voltage drop (=2I× $2R_{wire}$=$4IR_{wire}$) is expected to double. If this is not the case, when there is a glowing connection, then the voltage drop will not be linear, thereby indicating a problem.

In accordance with the disclosed concept, a method of detecting a glowing contact in the example power circuit 2, which may be susceptible to an electrical connection fault, includes applying at least three different impedances, such as resistance values, across the power circuit 2 and responsively sensing at least three voltages ($V_2$) across the power circuit 2. Each of these voltages corresponds to one of the different resistance values, as formed, for example and without limitation, by any suitable combination of a number of the example resistors $R_{2a}, R_{2b}, R_{2c}$. Then, it is determined if changes in the sensed voltages ($V_2$) with respect to changes in the different resistance values are linear within a predetermined range and, otherwise, at least one of a trip signal and an alarm signal are responsively generated, in order to protect from and annunciate a glowing contact 4 in the power circuit 2.

In FIG. 5, a detector apparatus 6 including the three example resistors $R_{2a}, R_{2b}, R_{2c}$ is plugged into an outlet (not shown) of the power circuit 2. A processor (not shown, but see the example controller 8 of FIG. 6) in the detector apparatus 6 switches combinations of the three resistors $R_{2a}, R_{2b}, R_{2c}$ into the power circuit 2 and measures the resulting load voltages, $V_2$. If the differences in the sensed voltages are linear, then the power circuit 2 is good and there is no glowing contact. If the sensed voltages are not linear, then a problem in the wiring and/or electrical connections of the power circuit 2 is indicated. As will be described, the problem can be isolated by moving the detector apparatus 6 upstream (towards a load center or panelboard 10) until the nonlinear voltage measurement goes away.

EXAMPLE 1

Table 1, below, shows example values for a branch circuit with good electrical connections for an example 120 Vac with a 100 foot #12 AWG copper power cable. In this example, $R_{load}$ is the resistance formed by a suitable combination of a number of the example resistors $R_{2a}, R_{2b}, R_{2c}$ of FIG. 5. The current, I, is the current flowing in the power circuit 2. $V_{drop}$ is the voltage drop which is equal to the power circuit current, I, times the resistance of the two power circuit conductors, $2R_{wire}$, or $2IR_{wire}$. $V_2$ refers to the three example sensed voltages $V_{2a}, V_{2b}, V_{2c}$, which correspond to the different resistance values 120Ω, 60Ω, 30Ω, respectively. The resistors $R_{2a}, R_{2b}, R_{2c}$ could have, for example and without limitation, values of 120Ω, 60Ω, 30Ω, respectively, such that $R_{load}$ is formed when switches Sa, Sb, Sc are respectively closed. As another non-limiting example, $R_{2a}, R_{2b}, R_{2c}$ could have values of 120Ω, 120Ω, 60Ω, respectively, such that $R_{load}$ is formed when: (a) switch Sa is closed ($R_{load}$=120Ω), (b) switches Sa and Sb are closed ($R_{load}$=60Ω), and (c) switches Sa, Sb and Sc are closed ($R_{load}$=30Ω).

TABLE 1

| $R_{load}$ (Ω) | I ($A_{rms}$) | $V_{drop}$ ($V_{rms}$) | $V_2$ ($V_{rms}$) | Reference |
|---|---|---|---|---|
| 120 | 1 | 0.32 | 119.68 | $V_{2a}$ |
| 60 | 2 | 0.64 | 119.36 | $V_{2b}$ |
| 30 | 4 | 1.28 | 118.72 | $V_{2c}$ |

In this example, if $V_{2a}-V_{2b}=½ (V_{2b}-V_{2c})$, then electrical connections in the power circuit 2 are good. For the example of Table 1, 119.68−119.36=½ (119.36−118.72)=0.32. If this equality is not true within a suitable predetermined tolerance range (e.g., without limitation, ±10%), then the power circuit 2 has a number of bad electrical connections, such as 4. If the power circuit 2 is bad, then this can be suitably annunciated (e.g., without limitation, a warning light (not shown) turns on; a warning buzzer (not shown) turns on; a switch (not shown) activates a suitable load (not shown) (e.g., without limitation, a thyristor, FET or IGBT activates a 0.5Ω load) that creates a fault current high enough to trip a branch feeder circuit breaker (not shown)).

Also, in this example, there are three different resistance values applied across the power circuit 2 at a component (not shown) of the power circuit 2. The component can be, for example and without limitation, an electrical outlet. Although three different resistance values formed by combinations of three different resistors are disclosed, at least two different resistors can be employed to provide three different resistance values, or four or more different resistance values can be employed. In this example, the three different resistance values correspond to about one unit of current, about two units of current and about four units of current flowing in the power circuit 2. The disclosed method and detector apparatus 6 determine a first change in the sensed voltages corresponding to a change of about one unit of current flowing in the power circuit 2, determine a second change in the sensed voltages corresponding to a change of about two units of current flowing in the power circuit 2, and determine if the second change is about double the first change and within the predetermined range and, otherwise, the at least one of the trip signal and the alarm signal are responsively generated.

EXAMPLE 2

The detector apparatus 6 can be used for spot checking different power circuits or can be a dedicated module that remains plugged into one outlet for one power circuit. The dedicated detector apparatus 6 can be designed to periodically check (e.g., without limitation, every 30 minutes by using a timer 42 as shown with the detector apparatus 12 of FIG. 6) the power circuit 2. The resolution of the voltage measurement may need to be increased if other load currents are flowing during the voltage measurements. The detector apparatus 6 is most accurate without any other load currents flowing in the power circuit 2.

The detector apparatus 6 can include a conventional male plug (not shown) to engage an outlet (see, for example, the outlets 60,62,64 of FIG. 6) or receptacle of the power circuit 2. The plurality of switches Sa,Sb,Sc are structured to switch a number of the resistors $R_{2a},R_{2b},R_{2c}$ across the power circuit 2 at the outlet or receptacle of the power circuit 2. The detector apparatus 6 may either temporarily engage the power circuit 2 for a single detection cycle or may permanently engage the power circuit 2, with the processor (not shown) being structured to periodically check the power circuit 2 for a glowing contact, such as 4.

EXAMPLE 3

Figure 6:
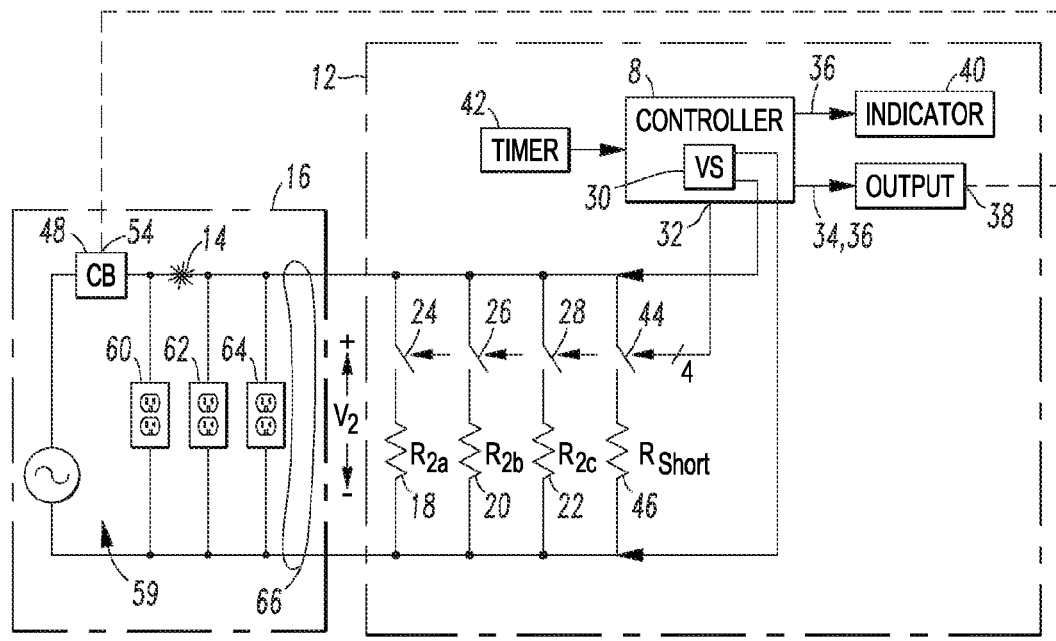
FIG. 6 is a block diagram in schematic form of a loose/glowing connection detector apparatus in accordance with another embodiment of the disclosed concept.

FIG. 6 shows another loose/glowing connection detector apparatus 12. The example detector apparatus 12 detects a glowing contact 14 in a power circuit 16, which may be susceptible to an electrical connection fault. The detector apparatus 12 includes a plurality of resistors 18,20,22, a plurality of switches 24,26,28 (e.g., mechanical; solid state) structured to switch a number of the resistors 18,20,22 across the power circuit 16, a voltage sensor (VS) 30 structured to sense a voltage ($V_2$) across the number of the resistors 18,20, 22 switched across the power circuit 16, and a processor, such as the example controller 8. The controller 8 is structured to control, through outputs 32, the plurality of switches 24,26,28 to switch at least three different resistance values across the power circuit 16, to input the sensed voltage corresponding to each of the at least three different resistance values, and to determine if changes in the sensed voltage with respect to changes in the at least three different resistance values are linear within a predetermined range and, otherwise, to responsively generate at least one of a trip signal 34 and an alarm signal 36 corresponding to detecting the glowing contact 14 in the power circuit 16. The controller 8 includes an output 38 of the at least one of the trip signal 34 and the alarm signal 36. A local indicator 40 may also be employed to annunciate the alarm signal 36.

The example controller 8 controls the plurality of switches 24,26,28 to switch each of the at least three different resistance values across the power circuit 16 for, without limitation, at least about ten line cycles, in sequence, as timed by the timer 42. This provides a suitable time for the load voltage $V_2$ to stabilize and be sensed by the voltage sensor 30.

The controller outputs may be, for example and without limitation, a visible indicator 40, an audible indicator 40, or a switch 44 structured to activate a suitable load 46 ($R_{short}$) to cause a sufficient fault current to flow in the power circuit 16 to trip an upstream circuit interrupter (CB) 48 operatively associated with the power circuit 16. For example, the detector apparatus 12 can apply another different resistance value (e.g., without limitation, 0.5Ω) across the power circuit 16 responsive to the trip signal 34 in order to cause, for example and without limitation, an instantaneous magnetic trip of the example upstream branch circuit interrupter 48.

EXAMPLE 4

Table 2 shows example glowing contact voltage values from FIG. 4 at 1 $A_{rms}$, 2$A_{rms}$, and 4 $A_{rms}$, at 120 Vac.

TABLE 2

| Material Combination | Voltage ($V_{rms}$) at 1 $A_{rms}$ | Voltage ($V_{rms}$) at 2 $A_{rms}$ | Voltage ($V_{rms}$) at 4 $A_{rms}$ |
|---|---|---|---|
| Cu—Cu | 8.80 | 6.00 | 4.50 |
| Cu—SS | 3.30 | 3.00 | 2.50 |
| Brass-Fe | 2.40 | 2.10 | 1.51 |

Table 3, below, is based upon a power circuit with a 50 foot length of #12 AWG cable at 1.588 mΩ/ft per conductor, or $R_{wire}$=0.001588 Ω/ft of FIG. 5. The open circuit voltage, $V_{OC}$, is 120 $V_{rms}$, the three test currents are 1 $A_{rms}$ ($I_A$), 2 $A_{rms}$ ($I_B$) and 4 $A_{rms}$ ($I_C$), and the three effective resistances are 120Ω, 60Ω and 30Ω, respectively, which are formed by combinations of a number of the resistors $R_{2a}$, $R_{2b}$ and $R_{2c}$. $V_{drop}$ is the voltage drop across $2R_{wire}$ plus the voltage drop across the glowing contact. The voltage, $V_2$, is measured at the three test currents and is represented by $V_{2A}$, $V_{2B}$ and $V_{2c}$, while $V_{dropA}$, $V_{dropB}$ and $V_{dropC}$, respectively, are the corresponding values of $V_{drop}$. $R_1$ is the effective change in resistance for a 1 $A_{rms}$ change in current as determined from $R_1=(1/(I_A-I_B))(V_{2A}-V_{2B})=(V_{2A}-V_{2B})$. Similarly, $R_2$ is the effective change in resistance for a 2 $A_{rms}$ change in current as determined from $R_2=(1/(I_B-I_C))(V_{2B}-V_{2C})=((\frac{1}{2})(V_{2B}-V_{2C})$. The test, $\Delta=R_1-R_2$, corresponds to the test discussed above in connection with Table 1. Here, the test is if $-0.1$ |(greater of $R_1$ or $R_2$)|<$\Delta$<0.1|(greater of $R_1$ or $R_2$)|, then there is no glowing contact. Otherwise, there is a glowing contact or some other undesired abnormality. Also, any negative value of $R_1$ or $R_2$ immediately indicates a glowing contact. In Table 3, for all three materials, each of $R_1$ or $R_2$ indicates a glowing contact. Similarly, for the test $-0.1$|(greater of $R_1$ or $R_2$)|<$\Delta$<0.1| (greater of $R_1$ or $R_2$)|, both of the Cu—Cu and Cu—SS examples are glowing contacts. For Brass-Fe, which has the lowest glowing contact voltage, this test does not apply since $R_1$ (and $R_2$) must be positive. Instead, the negative value of $R_1$ (or $R_2$) immediately indicates a glowing contact.

In Table 3, currents are in $A_{rms}$, voltages are in $V_{rms}$, and resistances are in $\Omega$.

EXAMPLE 5

A number of different tests can be employed: (1) at least three different currents are used to check for a linear response (e.g., without limitation, $V_{2a}-V_{2b}=\frac{1}{2}(V_{2b}-V_{2c})$ of Example 1), if not there is a glowing contact; (2) two different currents (e.g., without limitation, 1 $A_{rms}$ and 2 $A_{rms}$; 2 $A_{rms}$ and 4 $A_{rms}$) are used to check if the voltage ($V_2$) decreases linearly, if not there is a glowing contact; (3) two different currents are used to check if the voltage ($V_2$) decreases linearly, and at least three different currents are used to check for a linear response, if not there is a glowing contact (e.g., this is the combination of the second and third tests); and (4) one current and the open circuit voltage (or two currents, one of which is zero and corresponds to an "infinite" open circuit resistance value) are used to check if the voltage ($V_2$) decreases by an excessive amount, if yes there is a glowing contact.

In the first test, the example equation is only for the specific example currents of 1 $A_{rms}$, 2 $A_{rms}$ and 4 $A_{rms}$. A more general equation is discussed above in connection with Table 3. Hence, defining the value, A, and checking to see if this value is less than the predetermined allowed tolerance (e.g., without limitation, 10%) is a better, more general way to check for linearity. Alternatively, with two currents in the second and third tests, linearity is also determined based on the expected

TABLE 3

| Material Combination | $V_{dropA}$ | $V_{dropB}$ | $V_{dropC}$ | $V_{2A}$ | $V_{2B}$ | $V_{2C}$ | $R_1$ | $R_2$ | $\Delta$ |
|---|---|---|---|---|---|---|---|---|---|
| Cu—Cu | 8.959 | 6.318 | 5.135 | 110.882 | 113.365 | 114.230 | -2.641 | -0.591 | -2.050 |
| Cu—SS | 3.459 | 3.318 | 3.135 | 116.382 | 116.365 | 116.230 | -0.141 | -0.091 | -0.050 |
| Brass-Fe | 2.559 | 2.418 | 2.145 | 117.282 | 117.265 | 117.220 | -0.141 | -0.136 | -0.005 |

Although the "three current" test of Table 3 is disclosed, greater accuracy can be obtained by checking the linearity of response using four or more currents. For suitable detection of all conditions, without limitation, at least about a 0.1% resistor tolerance and about a 1 mV resolution of the voltage measurement can be employed.

Although tests involving at least three currents with at least three different resistance values and at least three sensed voltages are disclosed, tests involving one or two currents are still possible especially for glowing materials, such as Cu—Cu, which have relatively higher glowing contact voltages.

Table 4 shows the results, based upon Table 3, for both a "two current" test using the two test currents 1 $A_{rms}$ and 2 $A_{rms}$, and a "one current" test using the open circuit voltage, $V_{on}$, at 0 $A_{rms}$ and the one test current 1 $A_{rms}$. For the "two current" test a negative value of $V_{2A}-V_{2B}$ indicates a glowing contact, while for the "one current" test a relatively large value (e.g., without limitation, >0.4 $V_{rms}$ at 1 $A_{rms}$ for a 100 foot power circuit using #12 AWG cable) indicates a problem. The "one current" test works best at relatively low currents in the range of about 1 $A_{rms}$ to about 5 $A_{rms}$.

TABLE 4

| Material Combination | $V_{2A}-V_{2B}$ | $V_{OC}-V_{2A}$ |
|---|---|---|
| Cu—Cu | -2.641 | 8.959 |
| Cu—SS | -0.141 | 3.459 |
| Brass-Fe | -0.141 | 2.559 | voltage drop for a given current. Any three suitable values of current can be used within limits. For example, if the current is too low, the glowing contact may not be present (e.g., less than 1 $A_{rms}$), or if the current is too high, then the circuit breaker may trip (e.g., without limitation, greater than 15 $A_{rms}$ or 20 $A_{rms}$) and it becomes more difficult to detect a problem when the current is too high. For example and without limitation, a suitable current range is about 1 $A_{rms}$ to about 10 $A_{rms}$.

The second test, which uses two currents, also checks linearity similar to the first test using three currents. Using a known current (e.g., without limitation, 1 $A_{rms}$) produces a voltage drop resulting in a reduced voltage available at the outlet (i.e., $V_{2A}=V_{OC}-V_{wire}$) where $V_{wire}=2IR_{wire}=2R_{wire}$. Then, a voltage drop is defined as DeltaA=$V_{OC}-V_{2A}=V_{OC}-(V_{OC}-2R_{wire})=2R_{wire}$. If, for example and without limitation, 2 $A_{rms}$ is then applied as a load on the circuit, then twice the wire voltage drop is expected; hence, $V_{2B}=V_{OC}-4R_{wire}$. Then, DeltaB=$V_{OC}-V_{2B}=4R_{wire}=2$DeltaA, since the circuit is linear.

However, if there is a glowing contact present at the two example current levels, then since the glowing voltage is a function of current (e.g., at 1 $A_{rms}$, $V_{2A}=V_{OC}-2R_{wire}-V_{glowA}$, and at 2 $A_{rms}$, $V_{2B}=V_{OC}-4R_{wire}-V_{glowB}$), DeltaA=$V_{OC}-V_{2A}=V_{OC}-(V_{OC}-2R_{wire}-V_{glowA})$ and DeltaB=$V_{OC}-V_{2B}=V_{OC}(V_{OC}-4R_{wire}-V_{glowB})$. But now, DeltaA and DeltaB are a function of the glowing contact voltages, which are non-linear (e.g., doubling the current does not double the glowing contact voltage, it actually decreases).

The third test is similar to the first test. Two currents are employed to check for linearity since a purely resistive circuit response should be linear. Any non-linearity indicates a potential problem.

The fourth test only checks if the voltage drop is greater than some expected amount (e.g., without limitation, for #12 AWG (0.001588× estimated line length×2×current) or for #14 AWG (0.002525× estimated line length×2×current)). If the voltage drop is 50% to 500% greater than this number, then there may be a problem. This test is not believed to be as reliable as the other tests, but can provide a relatively quick initial check.

These tests determine if a number of changes in the sensed voltages with respect to a number of changes in the different resistance values is (are) linear within a predetermined range, or if a change in two of the sensed voltages does not increase with a decrease in two of the different resistance values.

EXAMPLE 6

Figure 7A:
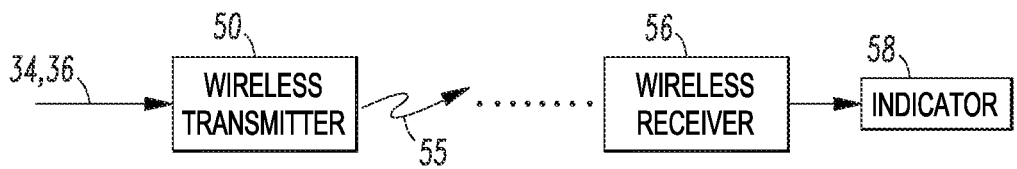
FIGS. 7A and 7B are block diagrams in schematic form of different outputs of the loose/glowing connection detector apparatus of FIG. 6.
Figure 7B:
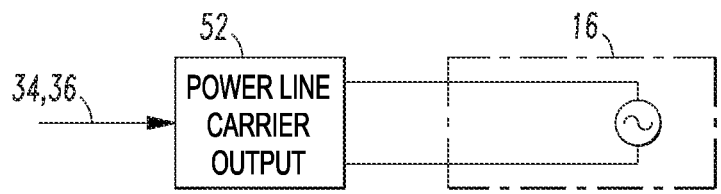

FIGS. 7A and 7B respectively show that the processor output 38 of FIG. 6 can be a wireless transmitter 50 to wirelessly transmit the alarm signal 36 and/or the trip signal 34, or a power line carrier output 52 to output the alarm signal 36 and/or the trip signal 34 over the power circuit 16.

EXAMPLE 7

Further to Example 6, the trip signal 34 can be employed to trip a circuit interrupter, such as the example upstream branch circuit breaker 48 operatively associated with the power circuit 16. The processor output 38 transmits the trip signal 34 to trip the circuit interrupter 48, which trips (e.g., through a shunt trip input 54) responsive to receipt of the trip signal 34.

EXAMPLE 8

Further to Example 6, the alarm signal 36 can be employed to remotely annunciate the alarm condition. For example, as shown in FIG. 7A, the processor output 50 wireless transmits the alarm signal 36 to remotely annunciate the glowing contact 14. A wireless signal 55 is received by a wireless receiver 56 and output by an indicator 58 at a remote location.

EXAMPLE 9

As shown in FIG. 6, the detector apparatus 12 is ideally at the end of the power circuit 12 (e.g., a branch circuit) and distal from a load center or panelboard 59, with no other loads being powered. If a load is active somewhere on the branch circuit, then the sensed voltage $V_2$ at the end of the branch circuit will be the sum of the IR wire drop up to the point of the load plus the IR drop from the remaining wire to the detector apparatus 12 plus, if present, the glowing contact voltage, which value will depend on whether it is located upstream or downstream of the branch load. A nonlinearity should still show up in the measurement when the example detector apparatus 12 changes the example current from 1 A to 2 A to 4 A; however, the example ±10% tolerance may be too large to allow this case to be discriminated. The detection becomes harder the longer the wire length.

EXAMPLE 10

The disclosed detector apparatus 12 and method can be employed to determine the location of the example glowing contact 14 in the example power circuit 16. For example, if the power circuit 16 includes the load center 59 having the circuit interrupter 48 and a plurality of outlets 60,62,64,66 downstream from the load center 59 and the circuit interrupter 48, then the at least three different resistance values are first applied across the power circuit 16 at the outlet 66, which is most distal from the load center 59. This detects the glowing contact 14 in the power circuit 16. Then, by progressively applying the different resistance values across the power circuit 16 at a number of the outlets, such as 64,62,60, closer to the load center 59 than the outlet 66, this can be continued until the glowing contact 14 is not detected in the power circuit 16. This occurs at the outlet 60, in this example, since there is no glowing contact upstream of the outlet 60 between it and the circuit interrupter 48. As a result, it can be determined that the glowing contact 14 is in the power circuit 16 between two of the outlets, 60,62, as shown, or is between the load center 59 and the closest outlet 60 (not shown by the example glowing contact 14).

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A method of detecting a glowing contact in a power circuit, said method comprising:

applying at least two different resistance values across said power circuit and responsively sensing at least two voltages across said power circuit, each of said at least two voltages corresponding to one of said at least two different resistance values;

determining if a number of changes in said sensed at least two voltages with respect to a number of changes in said at least two different resistance values is linear within a predetermined range or if a change in two of said sensed at least two voltages does not increase with a decrease in two of said at least two different resistance values and, otherwise, responsively generating at least one of a trip signal and an alarm signal corresponding to detecting the glowing contact in said power circuit; and employing as said at least two different resistance values three different resistance values corresponding to about one unit of current, about two units of current and about four units of current flowing in said power circuit.

2. A method of detecting a glowing contact in a power circuit, said method comprising:

applying at least two different resistance values across said power circuit and responsively sensing at least two voltages across said power circuit, each of said at least two voltages corresponding to one of said at least two different resistance values;

determining if a number of changes in said sensed at least two voltages with respect to a number of changes in said at least two different resistance values is linear within a predetermined range or if a change in two of said sensed at least two voltages does not increase with a decrease in two of said at least two different resistance values and, otherwise, responsively generating at least one of a trip signal and an alarm signal corresponding to detecting the glowing contact in said power circuit;

employing as said at least two different resistance values three different resistance values;

employing as said at least two voltages three voltages;

determining a first change in said sensed three voltages corresponding to a change of about one unit of current flowing in said power circuit;

determining a second change in said sensed three voltages corresponding to a change of about two units of current flowing in said power circuit; and determining if the second change is about double the first change and within the predetermined range and, otherwise, responsively generating said at least one of the trip signal and the alarm signal.

3. A method of detecting a glowing contact in a power circuit, said method comprising:

applying at least two different resistance values across said power circuit and responsively sensing at least two voltages across said power circuit, each of said at least two voltages corresponding to one of said at least two different resistance values;

determining if a number of changes in said sensed at least two voltages with respect to a number of changes in said at least two different resistance values is linear within a predetermined range or if a change in two of said sensed at least two voltages does not increase with a decrease in two of said at least two different resistance values and, otherwise, responsively generating at least one of a trip signal and an alarm signal corresponding to detecting the glowing contact in said power circuit;

employing said power circuit comprising a load center, a circuit interrupter and a plurality of outlets downstream from said load center;

first applying said at least two different resistance values across said power circuit at a first one of said outlets distal from said load center and detecting the glowing contact in said power circuit; and progressively applying said at least two different resistance values across said power circuit at a number of said outlets closer to said load center than the first one of said outlets until the glowing contact is not detected in said power circuit.

4. A method of detecting a glowing contact in a power circuit, said method comprising:

applying at least two different resistance values across said power circuit and responsively sensing at least two voltages across said power circuit, each of said at least two voltages corresponding to one of said at least two different resistance values;

determining if a number of changes in said sensed at least two voltages with respect to a number of changes in said at least two different resistance values is linear within a predetermined range or if a change in two of said sensed at least two voltages does not increase with a decrease in two of said at least two different resistance values and, otherwise, responsively generating at least one of a trip signal and an alarm signal corresponding to detecting the glowing contact in said power circuit;

employing as said at least two different resistance values two different resistance values;

employing as said at least two voltages two voltages; and determining if the change in the two voltages does not increase with the decrease in the two different resistance values.

5. The method of claim 4 further comprising:

employing as one of said two different resistance values an open circuit resistance value; and employing as a corresponding one of said two voltages an open circuit voltage value.

6. An apparatus for detecting a glowing contact in a power circuit, said apparatus comprising:

a plurality of resistors;

a plurality of switches structured to switch a number of said resistors across said power circuit;

a voltage sensor structured to sense a voltage across said number of said resistors switched across said power circuit;

a processor structured to control said plurality of switches to switch at least two different resistance values across said power circuit, to input the sensed voltage corresponding to each of said at least two different resistance values, and to determine if a number of changes in the sensed voltage with respect to a number of changes in said at least two different resistance values is linear within a predetermined range or if a change in the sensed voltage does not increase with a decrease in two of said at least two different resistance values and, otherwise, to responsively generate at least one of a trip signal and an alarm signal corresponding to detecting the glowing contact in said power circuit;

an output of said at least one of the trip signal and the alarm signal; and wherein a circuit interrupter is operatively associated with said power circuit; and wherein said output is selected from the group consisting of a visible indicator, an audible indicator, and a switch structured to activate a load to cause a fault current to trip the circuit interrupter.

7. The apparatus of claim 6 wherein said power circuit comprises an outlet; and wherein said plurality of switches are structured to switch the number of said resistors across said power circuit at the outlet of said power circuit.

8. The apparatus of claim 6 wherein said predetermined range is about ±10%.

9. The apparatus of claim 6 wherein said apparatus is structured to temporarily engage said power circuit.

10. The apparatus of claim 6 wherein said apparatus is structured to permanently engage said power circuit; and wherein said processor is further structured to periodically check said power circuit for said glowing contact.

11. The apparatus of claim 6 wherein said processor is further structured to control said plurality of switches to switch each of said at least two different resistance values across said power circuit for at least about ten line cycles.

12. The apparatus of claim 6 wherein said output is structured to transmit said at least one of the trip signal and the alarm signal wirelessly or by a power line carrier.

13. The apparatus of claim 6 wherein a circuit interrupter is operatively associated with said power circuit; and wherein said output is structured to transmit the trip signal to trip said circuit interrupter.

14. The apparatus of claim 6 wherein said output is structured to transmit the alarm signal to remotely annunciate the glowing contact.

* * * * *